United States Patent [19]

Haley et al.

[11] 4,210,773
[45] Jul. 1, 1980

[54] WIRING HARNESS

[75] Inventors: Roy Haley, Meysey; Brian Cooper, Marlborough; Pushpkumar D. Changani, Swindon, all of England

[73] Assignee: Raychem Limited, London, England

[21] Appl. No.: 852,571

[22] Filed: Nov. 17, 1977

[30] Foreign Application Priority Data

Nov. 22, 1976 [GB] United Kingdom ............... 48669/76

[51] Int. Cl.² .............................................. H02G 3/00
[52] U.S. Cl. .................................................. 174/72 A
[58] Field of Search ........................ 174/72 A, 117 F; 339/148

[56] References Cited

U.S. PATENT DOCUMENTS 4,051,383  9/1977  Dola ................................ 174/72 A

FOREIGN PATENT DOCUMENTS 2616272   4/1976  Fed. Rep. of Germany ....... 174/117 F
 825830  12/1959  United Kingdom .
1403431   8/1975  United Kingdom .
1451638  10/1976  United Kingdom .
1458214  12/1976  United Kingdom .

Primary Examiner—Roy N. Envall, Jr.
Attorney, Agent, or Firm—Lyon & Lyon

[57] ABSTRACT

A wiring harness, and a method for making it, which comprises positioning the wires in a desired configuration and applying a bonding agent as a fluid coating. The method is especially suitable for use with wires insulated with crosslinked polymer insulation.

7 Claims, 3 Drawing Figures

WIRING HARNESS

The present invention relates to wiring harnesses and a method for their manufacture.

The insulated electrical conductors (wires) which carry current to the electrical components of for example a vehicle such as an automobile or an aircraft, a computor or a business machine, or other complex electronic equipment, are often gathered together and tied or otherwise collected in a bundle known as branch leads or transition leads. The branch leads may in their turn be divided into smaller bundles, all of which are provided with means to facilitate their connection to the electrical equipment. A bundle or other collection of wires having one or more branch leads is known as a wiring harness. There are heavy demands on a wiring harness in complex electronic equipment, especially in airborne vehicles, and it has often been found that bundled wiring harnesses are too bulky for the space provided. Especially in airborne vehicles the wiring harness is also required to be of a light weight construction.

In many applications, the requirement to save space is so stringent that compliance with it necessitates the use of a flat compact wiring harness and, to this end, the use of a ribbon cable construction has been proposed. Ribbon cables, being composed of a plurality of wires laid in a generally planar configuration, are usually constructed in long lengths by embedding bare conductors in a polymeric insulating material, by bonding together insulated conductors on a backing sheet, or by knitting or weaving insulated conductors together.

The use of a ribbon cable in making up a wiring harness has the disadvantage that, in order to divide the cable into one or more branch leads, the portion of the ribbon cable intended to form the branch lead has to be separated from the rest of the ribbon cable and bent, twisted or folded over on itself. This physical manipulation of the cable often results in damage to the conductors, the insulation, or both, and increases the bulk and/or the weight of the harness in the area of the fold.

It has now been found that a compact and lightweight harness having a plurality of branch leads can be made without the need to fold the conductors.

Accordingly the present invention provides a method of making a wiring harness comprising a plurality of elongate electrical conductors spatially arranged to provide at least a first lead comprising at least two electrical conductors and at least a second lead extending therefrom comprising at least two electrical conductors, the electrical conductors of the wiring harness being arranged in electrically insulating spatial relation, which method comprises arranging the plurality of individual electrical conductors in the desired electrically insulated spatial relation and subsequently fixing the electrical conductors in the spatial relation by means of a bonding agent, which is advantageously applied as a fluid coating, preferably as a liquid.

The first lead will hereinafter be referred to as a main lead, and the second as a branch; it will be understood that the harness may contain one or more branches, containing one or more conductors and/or one or more main leads, in addition to those specified.

The method of the invention is particularly suited to making a wiring harness having at least a section comprising a plurality of individual elongate electrical conductors arranged together in electrically insulated spatial relation, the conductors lying in a plane and having a change in direction lying in the plane of the electrical conductors.

Accordingly the present invention provides a wiring harness having at least a section comprising a plurality of individual elongate electrical conductors arranged at least partly in a common plane in electrically insulated spatial relation and having a change in direction along the length thereof, the radius of curvature of the change in direction lying in the plane of the electrical conductors, the electrical conductors being fixed in the spatial relation by means of a bonding agent applied as a fluid coating thereto.

The method of the present invention is particularly suited to making a wiring harness having at least one branch lead, of which the electrical conductors at the point of branching being arranged individually into the spatial relation required by the branch lead. The method of the present invention is especially suited to making a wiring harness having a plurality of electrical conductors and at least one branch lead comprising a plurality of electrical conductors, the electrical conductors at the point of branching being arranged individually to lie together in a planar spatial relation.

A particular advantage of the present invention is that a wiring harness may be prepared having a planar curve whose internal radius is dependent only upon the radius of that curve to which any one of the individual conductors may safely be bent without damage to the conductor and/or its insulation, and accordingly enables a harness to be made in which the radius of curvature of two or more wires is the minimum possible (by which will be understood the minimum possible without such damage) for the wires, as opposed to the case of a ribbon cable, where only the inner conductor has the minimum possible curvature radius.

In one aspect of the invention there is provided a wiring harness comprising a plurality of electrical conductors arranged to provide at least one main lead comprising a plurality of electrical conductors and at least one branch lead comprising a plurality of electrical conductors extending therefrom, the electrical conductors of the wiring harness being arranged in electrically discrete spatial relation such that the spatial arrangement of the individual electrical conductors in the main lead is maintained without a substantial change in plane at the point of branching and in the branch lead formed thereby, the electrical conductors being fixed in the discrete spatial relation by means of a bonding agent.

The present invention is particularly applicable to the production of wiring harnesses having a planar construction and will subsequently by described in relation thereto though it is to be understood that the invention is not limited to such a construction.

Electrical conductors which are not individually electrically insulated may be arranged in the required spatial relation by laying them side by side with a gap between so that they are not in electrical contact. Preferably however the electrical conductors are provided individually with electrical insulation so that they may be arranged with the insulation in contact in the required spatial relation.

Once the spatial relation of the electrical conductors is chosen it may be marked on a board or other flat surface. It may be drawn onto the board or the board may be provided with upstanding or depressed contours which delineate the desired form of the wiring harness as finally constructed and about which the electrical conductors may be arranged. The marked areas of the board may be provided with some tacky material to which the electrical conductors can be adhered to hold them in place whilst being arranged. Alternatively the whole surface of the board may be tacky and partially masked to provide tacky areas representing the final spatial relation and non-tacky areas. Alternatively the wires may be held on the marked areas by pins or the like. In the preferred method of the invention a board may be provided with upstanding formers, around which the electrical conductors may be laid in the desired spatial relation.

The invention is particularly applicable to the production of wiring harnesses composed of electrical conductors of various sizes and/or constructions. For example the wiring harness may be composed of primary wires, that is electrical conductors which are provided with electrical insulation; coaxial cables, that is primary wires which are provided with an electrical screen or shield and an outer electrical insulation; twisted primary wire pairs; triple twisted primary wires or lengths of wires which are knitted or woven together and any of these may be the same or different in thickness.

Any type of electrical conductor, for example a stranded or solid conductor, can be used in the wiring harness of the invention; the invention is especially suitable for use when conductors of two or more different diameters are to be harnessed.

Among the types of electrically insulated electrical conductors suitable for use in the invention there may be mentioned those provided with an insulation composed of a polymer, e.g., a polyolefin for example a polyethylene; polyvinylidene fluoride, polyvinyl chloride, polytetrafluoroethylene, or a copolymer of an olefin, for example ethylene/vinyl acetate, ethylene/-tetrafluoroethylene, or a terpolymer of ethylene, tetrafluoroethylene, and a perfluorovinyl ether; a polyamide, a polyimide or a combination thereof. The materials of which the insulation is composed are preferably crosslinked, and the process of the invention can be used successfully on such materials where earlier, prior art, methods have failed dismally.

Especially there may be mentioned electrical conductors insulated by means of an inner coating of a polyethylene, and one or more outer coatings of a polyvinylidene fluoride, especially those disclosed and claimed in British Pat. No. 1,117,118.

Once the wires have been arranged and held in the required spatial relation they are ready to be fixed in the spatial relation by means of a bonding agent.

The bonding agent may be applied as a coating in the form of a paste, paint or varnish and may be applied by for example painting, spraying or rolling. The application of neither heat nor pressure is necessary, although one or both may, if desired, be used. The bonding agent may be applied such that it is coated as a layer on one face presented by the arranged electrically insulated electrical conductors and it may be allowed to penetrate any interstices between them. A backing sheet is not necessary, although the process of the invention does not exclude its use. When non-electrically insulated conductors are used to make up all or part of the wiring harness, a bonding agent having electrically insulating properties may be used to provide electrical insulation between them and for them as well as to bond them together.

Once the bonding agent has effectively fixed the electrical conductors in the required spatial relationship, the harness may be removed from the board and provided with whatever connectors or other electrical components are necessary.

Among the suitable bonding agents there may be mentioned adhesives for example hot melt adhesives and curing adhesives, either room temperature curing adhesives, or thermosetting adhesives. The bonding agent may be composed of a polymeric material which is applied while molten, and which sets on cooling. Preferably, however, the bonding agent is a polymer, and is applied in solution in a suitable solvent. The bonding agent, if polymeric, may be applied as a crosslinkable system.

An especially preferred bonding agent is one which is chemically compatible with the insulation of electrical conductors. Most especially there may be mentioned as a bonding agent a polymeric material which is the same as or chemically similar to the electrical insulation. A particularly preferred bonding agent is polyvinylidene fluoride in solution in a suitable solvent for example dimethyl acetamide or dimethyl formamide which is used to bond electrical conductors, at least the outside layer of the insulation of at least one of which is polyvinylidene fluoride.

Two constructions of a wiring harness according to the invention will now be described by way of example only, with reference to the accompanying drawings in which.

Figure 1:
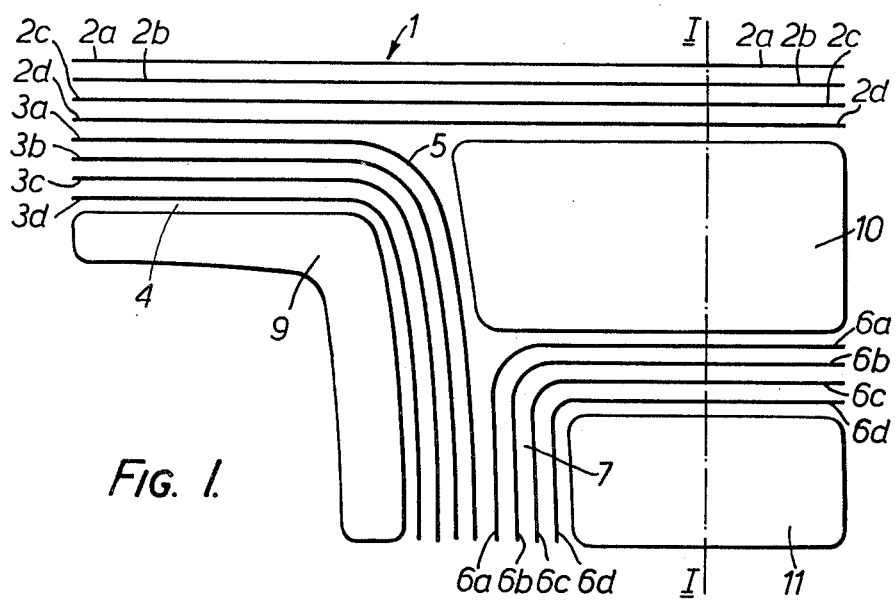
FIG. 1 is a plan view of a first form of wiring harness constructed according to the invention.
Figure 2:
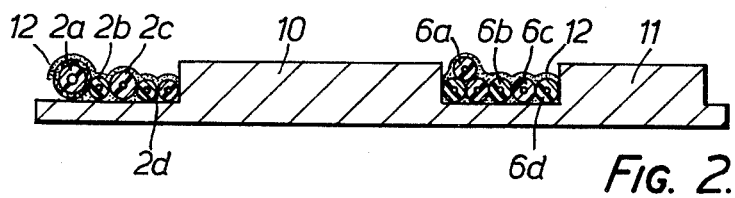
FIG. 2 is a cross-section taken through line I—I of FIG. 1.

Referring now to FIGS. 1 and 2, a first wiring harness according to the invention, indicated generally by reference numeral 1, comprises a series of electrically insulated electrical conductors (wires). Wires 2a and 2d have been laid in straight lines, parallel to each other and in a common plane, such that wires 2a and 2b are contiguous, wires 2b and 2c are contiguous and wires 2c and 2d are contiguous. A further group of wires 3a to 3d are laid such that for a portion 4 of their length they are parallel to and in the same plane as wires 2a to 2d, and wires 2d and 3a are contiguous. At point 5, the branch point, wires 3a to 3d have been formed to follow a curve remaining in the plane of the wires 2a to 2d and 3a to 3d. Further wires 6a to 6d are laid such that for a portion of their length they are parallel to wires 3a to 3d and wires 3a and 6a are contiguous. At point 7, the branch point, wires 6a to 6d have been formed to follow a curve, the radius of the curve lying in the plane of the wires 2a to 2d, 3a to 3d and 6a to 6d.

The wiring harness shown generally by reference numeral 1 has been formed by laying the wires individually on a board which is provided with upstanding formers 9, 10 and 11. The area of the board between each former is provided with a layer of tacky material (now shown) and the wires are laid around the formers and held temporarily in place by adhesion to the tacky surface. When each wire has been laid in its place, the harness is coated by painting a solution of a bonding agent thereon, for example, an 18% by weight solution of polyvinylidene fluoride in dimethyl formamide is used to bond polyvinylidene fluoride insulated electrical conductors. The painted-on solution is then heated to about 160° C. to evaporate the solvent and the harness formed in its desired shape is then ready to be removed in one piece from the tacky surface of the board.

From FIG. 2 it can be seen that wires 2a to 2d are different in nature, being a coaxial cable, a primary wire, a larger primary wire and a twisted pair of primary wires respectively. Wires 6a and 6d consist of a twisted triple primary wire and three primary wires respectively. The bonding agent 12 has formed an irregular layer on one face of the wires.

Figure 3:
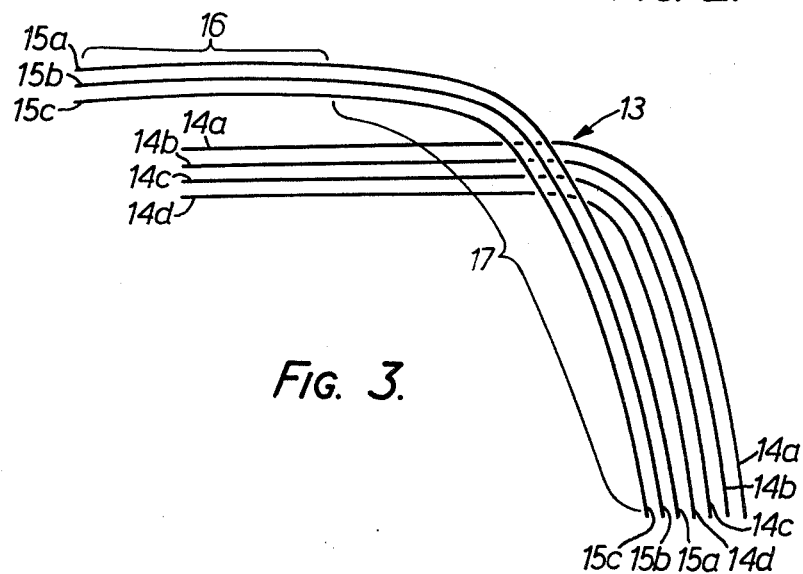
FIG. 3 shows a plan view of a portion of a second wiring harness constructed according to the invention.

A portion of a second wiring harness constructed in accordance with the invention and indicated generally by reference number 13 in FIG. 3 is composed of seven wires 14a to 14d and 15a to 15c. The wires 14a to 14d have been arranged to lie side by side in a curve, the radius of which lies in the plane of the wires. The wires 14a to 14d have been bonded together by means of a bonding agent. A portion 16 of wires 15a to 15c has been constructed by laying the wires side by side into a straight line, and fixing them in the desired configuration by the application of a bonding agent. The remaining portion 17 of the wires 15a to 15c extend beyond portion 16 and are not held together. The loose portion 17 has been laid to cross over a curved portion of the fixed wires 14a to 14d, being held in place by pins or tape, for example. The remainder of the portion 17 of the wires 15a to 15c is then arranged such that the wires lie parallel to and in the same plane as a curved portion of wires 14a to 14d such that wire 15a is contiguous with wire 14d. A bonding agent is then applied to portion 17 of wires 15a to 15c to bond them together, to the wires 14a to 14d at the crossing, and to bond wires 14d and 15a, forming the harness in the required shape.

We claim:

1. A wiring harness having at least a section comprising a plurality of individual elongate electrical conductors arranged at least partly in a common plane in electrically insulated spatial relation and having a change in direction along the length thereof, the radius of curvature of the change in direction lying in said plane, the electrical conductors being fixed in the spatial relation by means of a bonding agent applied as a fluid coating to the conductors after the conductors are arranged in the spatial relationship in the common plane.

2. A harness as claimed in claim 1, having a branch lead and a main lead.

3. A harness as claimed in claim 2, wherein the branch lead, at least at its junction with the main lead, lies at least partly in the plane.

4. A harness as claimed in claim 1, wherein the radius of curvature of at least two of the wires is the minimum possible for each of those wires.

5. A wiring harness having at least a section comprising a plurality of individual elongate electrical conductors having an insulation of a crosslinked polymeric material, said conductors being arranged at least partly in a common plane and having a change in direction along their length, the radius of curvature of the change in direction lying in said plane, said conductors being maintained in a fixed spatial relation to each other by a solvent-deposited polymeric bonding agent applied to the conductors after they are arranged in the spatial relationship in the common plane.

6. A harness as claimed in claim 1, wherein at least the outer layer of the polymeric material insulating at least one of said conductors is identical to the polymeric bonding agent.

7. A harness as claimed in claim 1, which comprises insulated electrical conductors of at least two different diameters.

* * * * *